United States Patent [19]

Bagdasarov et al.

[11] 4,303,465
[45] Dec. 1, 1981

[54] METHOD OF GROWING MONOCRYSTALS OF CORUNDUM FROM A MELT

[76] Inventors: Khachik S. Bagdasarov, ulitsa Garibaldi, 19, korpus 2, kv. 42; Valentin Y. Khaimov-Malkov, Jugo-Zapad, kvartal 42-a,5, kv. 57; Nikolai P. Ilin, ulitsa Vavilova, 39, kv. 7, all of Moscow; Jury A. Starostin, Leninsky raion, p/o Kommunerka, poselok Gezoprovod, 1, kv. 4, Moskovskaya oblast; Evgeny A. Fedorov, ulitsa Garibaldi, 23/56, korpus 4, kv. 23; Nikolai I. Sedakov, 1 Novokuznetsky pereulok, 11/13, kv. 14, both of Moscow, all of U.S.S.R.

[21] Appl. No.: 899,831

[22] Filed: Apr. 25, 1978

Related U.S. Application Data

[63] Continuation of Ser. No. 732,419, Oct. 14, 1976, abandoned, which is a continuation of Ser. No. 600,214, Jul. 30, 1975, abandoned, which is a continuation of Ser. No. 459,796, Apr. 10, 1974, abandoned, which is a continuation of Ser. No. 296,820, Oct. 12, 1972, abandoned.

[51] Int. Cl.³ ............................................. C30B 11/02
[52] U.S. Cl. ........................ 156/616 R; 156/DIG. 61; 156/DIG. 83
[58] Field of Search ...... 156/616 R, 617 H, DIG. 61, 156/DIG. 83; 164/60

[56] References Cited

U.S. PATENT DOCUMENTS 3,608,050  9/1971  Carman et al. ..................... 264/332

OTHER PUBLICATIONS

Lawson et al., Preparation of Single Crystals, London, Butterworth, 1958, pp. 57-58, 41, 14-18.

*Primary Examiner*—Hiram H. Bernstein
*Attorney, Agent, or Firm*—Holman & Stern

[57] ABSTRACT

A method for growing corundum monocrystals from a melt, and a heater in a device for carrying said method into effect.

According to the method the growth process of corundum monocrystals uses alumina placed in a container which is made of a group VI metal of the periodic table, and having a melting point above 2300° C. The growth process occurs in a shielding atmosphere with the use of Joule heating by passing the container with the melt through a temperature gradient effective across the crystallization zone.

The resistive heater used in the device is made as a bifilar coil of a solid tungsten bar.

16 Claims, 5 Drawing Figures

METHOD OF GROWING MONOCRYSTALS OF CORUNDUM FROM A MELT

This is a continuation of application Ser. No. 732,419, filed Oct. 14, 1976 which in turn is a continuation of Ser. No. 600,214, filed July 30, 1975 which in turn is a continuation of Ser. No. 459,796, filed Apr. 10, 1974 which in turn is a continuation of Ser. No. 296,820 filed Oct. 12, 1972, all of which are now abandoned.

BACKGROUND OF THE INVENTION

This invention relates to the sphere of growing corundum monocrystals (leucosapphire).

A method for growing corundum monocrystals from a melt by pulling on inoculation seed (Chokhralsky technique) is known in the present art and wherein, a blend or stock is charged into a container and heated until rendering same into a melt by using the energy of a H.F. electric field, and whereupon an inoculant is placed into the melt and a single crystal is pulled thereinto.

The method of a single-crystal growth process is run in an iridium container within an inert gas atmosphere.

A disadvantage inherent in the said technique of growing single crystals of corundum resides in the use of an iridium-made container. Such containers are critical, costly and short-lived which results in high production cost of the corundum crystals grown therein.

Another disadvantage of the known method lies in the difficulty of gowing large-sized monocrystals of corundum (200×100×15 mm and over). In said method, as a rule, only 50 percent the total volume of the melt is used for the growth of monocrystals. Therefore, for growing the large sized corundum monocrystals it is necessary to use either big iridium crucibles or to a complicated auxiliary equipment and apparatus which requires precision charging of the container with the blend as fast as the crystal is pulled from the melt.

Besides, the abovesaid growth technique for corundum monocrystals also requires an intricate apparatus for controlling the inert-gas shielding atmosphere. An insert gas is indispensable in the process in order to preclude an intense evaporation of the iridium container. However, some excess inert gas pressure of the gas hampers evaporation of the melt of not only this iridium but also a number of the impurities which affects the chemical purity of the stock blend.

Apart from the above-discussed disadvantages of the aforesaid method, the use of the energy of a H.F. field for heating the container to a great extent hinders the formation of the required temperature fields within the growth some of the monocrystal, also affecting the quality thereof.

SUMMARY OF THE INVENTION

It is therefore an object of the present invention to provide such a method for growing single crystals of corundum from a elt that would dispense with the use of an iridium-made container.

It is another object of the present invention to provide such a method that would be instrumental is growing a high-quality single crystals of corundum sized in excess of 200×100×15 mm.

It is still another object of the present invention is to provide a method which could use a less expensive blend having a lower chemical purity.

It is yet another object of the present invention to provide the utilization of method which would enable a 100-percent of the blend charged.

It is one more object of the present invention to provide such a method that would dispense with the use of the complicated apparatus used for the constant charging of the container with the blend the apparatus for the control of the inert-gas shielding atmosphere.

These and other object are attained due to the provision of a method for the growth of corundum monocrystals from a melt, wherein an alumina blend is charged into a container or crucible and heated with an electric current until molten, whereupon a monocrystal is grown by way of passing the melt through a preset temperature gradient within the crystallisation zone. According to the invention, the process runs under a shielding atmosphere in a container made of a metal selected from group VI of the periodic table and having its melting point above 2300° C. which involves the use of Joule heating.

It is expedient that, for growing an oriented monocrystal, an inocoulant having a preset orientation be placed into the container.

Thus, crystal growth may be carried out both on an inoculant having a preset orientation and by the method of spontaneous accuracy.

It is likewise expedient that the process of growing monocrystals occurs in a shielding atmosphere, vis., under a vacuum, an inert gas such as a nitrogen atmosphere.

The container is preferably made of molybdenum or tungsten.

Said metals are many hundreds of times cheaper than iridium and are more available.

It is expedient to heat the blend to a temperature ranging from 2075° to 2200° C.

The above-specified temperature range is an optimum one and may vary to suit the blend composition.

It is likewise expedient that the vacumised medium have a pressure of not above $5.10^{-5}$ Tor.

Such a pressure of the vacuumised medium is conductive for the growth of a quality monocrystal of corundum and protects the container from being oxidized.

It is also favourable that when a shielding atmosphere of an inert gas or nitrogen is used said atmosphere has an excess pressure of 0.2–0.5 atm.

The said pressure of the inert-gas or nitrogen shielding atmosphere is expedient whenever it is necessary to obtain the crystals of corundum with relatively volatile admixtures, since this not only decreases the rate of the evaporation of the admixture but also protects the container and the heater from being oxidized.

It is favourable that during the course of crystallisation the melt be passed along with the container with the latter being pulled at a velocity of 4–10 mm per hour.

Such a pulling velocity for the container contributes to the growth of a quality corundum monocrystal.

It is desirable that when the process occurs under vacuum a prepressed commercial alumina should be used as the blend.

Commercial alumina is many times cheaper than chemically pure alumina, and the prepressing thereof enables a higher bulk weight thereof to be used in the container.

It is also expedient that the temperature gradient within the crystallization zone be maintained within the range of 5°–40° per cm$^{-1}$.

In order to carry the above-disclosed method into effect, in a device for growing monocrystals from a melt, a resistive heater is expediently used, which is made as a bifilar coil of a solid tungsten bar.

Such a heater generates a uniformly distributed heat along the crystallization zone which is necessary for carrying into effect the herein-disclosed method of growing monocrystals of corundum from a melt.

It is preferable that the bifilar coil have a rectangular shape.

Such a coil shape provides favourable conditions for growing the rectangular crystalline plates of corundum.

The present invention provides for a method of growing monocrystals of corundum from a melt, the method being instrumental in growing corundum monocrystals sized in excess of 200×100×15 mm, and featuring high quality and making it possible to dispense with the complicated apparatus for constantly charging the container and, ensuring the control of an inert-gas shielding atmosphere and the formation of a preset temperature field.

BRIEF DESCRIPTION OF THE DRAWINGS

The invention is exemplified with the embodiments thereof being illustrated in conjunction with the accompanying drawings, wherein.

DETAILED DESCRIPTION OF THE PREFERRED EMBODIMENTS

The herein-proposed method of growing oriented monocrystals of corundum from a melt, say, in the shape of plates, is explained as follows.

Figure 1:
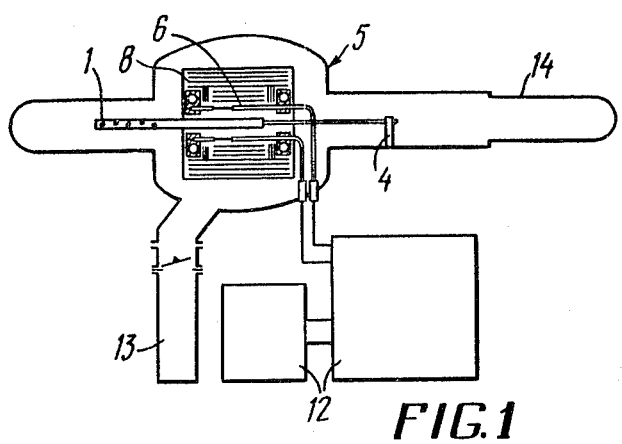
FIG. 1 is a diagrammatic view of a device for growing monocrystals of corundum from a melt, according to the invention, in the shape of plates.
Figure 2:
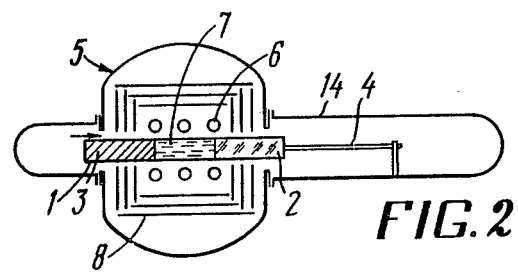
FIG. 2 is a diagrammatic view of the position assumed by the container in the course of growing a monocrystal of corundum.
Figure 4:
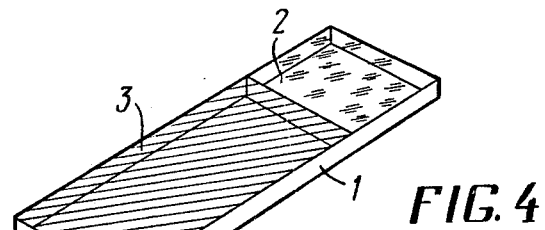
FIG. 4 is a diagrammatic view of a molybdenum (tungsten) container with a crystal seed and a blend in a device for growing oriented monocrystals of corundum from a melt, in the shape of plates.
Figure 5:
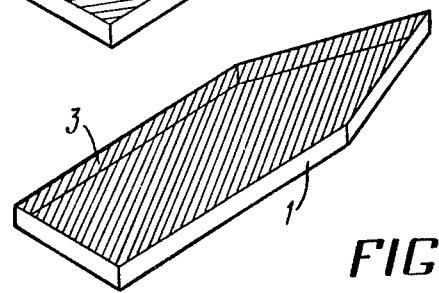
FIG. 5 shows the container of FIG. 4 but without the crystal seed, for a spontaneous nascency of corundum monocrystals.

A crystal seed 2 (FIGS. 2, 4) is placed into a container 1 (FIGS. 1, 2, 4 and 5) having the required orientation. The container is then charged with a stock blend 3 (FIGS. 2,4,5). The thus-charged container 1 is placed onto a pulling mechanism 4 (FIGS. 1,2) of a crystallization chamber 5 and introduced into a heater 6 (FIGS. 1,2,3) so that part of the crystal seed 2 goes into an expected temperature zone 7 (FIG. 2) of the melting of corundum.

The heater 6 is fashioned as a bifilar rectangular coil (FIG. 3) whose ends are fixed to water-cooled current leads. In order to provide a more efficient operation for the heater and increase the consistency of the temperature field thereof, the heater is surrounded by a system of rectangular screens 8 (FIGS. 1,2,3) arranged all around except for two opposite sides through which the container 1 is moved. In order to preclude the container from sagging at high temperatures and, thus, from possible shorts to the screens, it is held by special supports 9 (FIG. 3) made of tungsten and insulated in a colder zone close to a bottom screen 11, with plates 10 made of alundum ceramics.

Figure 3:
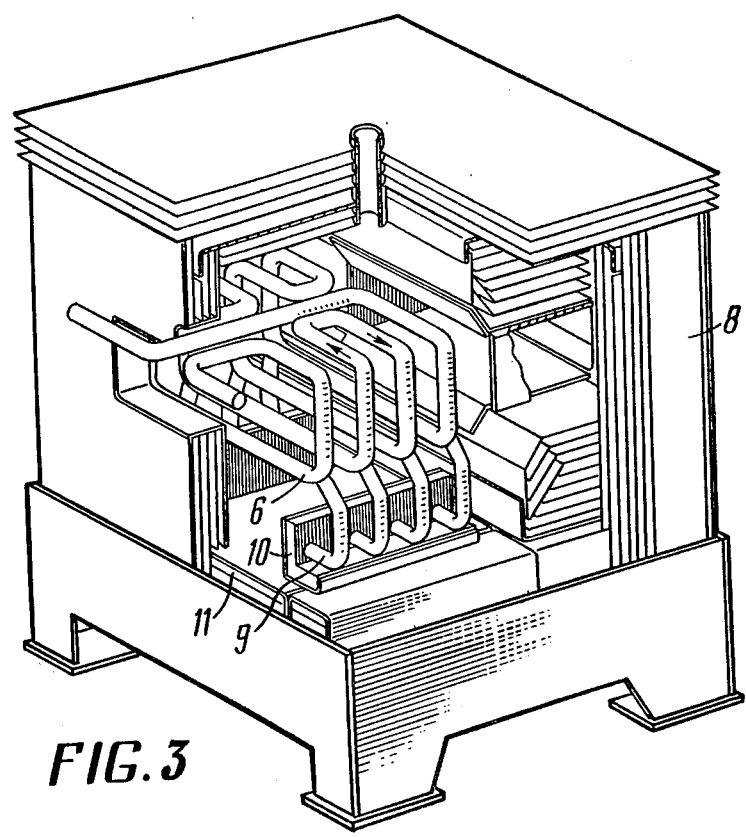
FIG. 3 is a slit-type tungsten heater with a system of tungsten-molybdenum screens in a device for growing monocrystals of corundum from a melt, in the shape of plates.

The electric power supply of the device is from transformers 12 (FIG. 1), while the required vacuum is established by corresponding vacuum pumps 13. The direction of the flow of electric current in the heater 6 is shown in FIG. 3 by arrows.

Once a rarefaction of not higher than 5·10$^{-5}$ Tor has been attained in the crystallization chamber 5, the blend 3 is subjected to melting.

Due to the provision of the heater 6 using Joule heating and the system of the screens 8 a temperature gradient of from 5° to 40° per cm$^{-1}$ is attained across the crystallization zone.

Further, the container 1 with the melt and a part of the crystal seed 2 is pulled into a receptacle 14 (FIGS. 1,2) at a velocity of 4 to 10 mm/hr (the direction of movement of the container 1 is shown by an arrow in FIG. 2). When the growth process is completed, the resultant monocrystal is cooled and withdrawn from the receptacle 14.

The properties of the materials of which the container 1 is made are such that the latter is mechanically free to separate from the corundum monocrystal.

Given below is an example of the crystallization under vacuum.

The monocrystals of a leucosapphire were grown according to the above-described technique. To this end a device with a 20-kW resistive heater was used. The temperature stabilization was within ±0.5° C., the degree of rarefaction inside the crystallization chamber, 5·10$^{-5}$ Tor. Briquetted commercial alumina was used as a blend for the growing monocrystals.

Molybdenum and tungsten containers sizing 200×100×15 mm were used for growing monocrystals of leucosapphire having different crystallographic orientation. The pulling velocity of the container was 8 mm/hr at an axial temperature gradient across the crystallization zone of 20°–30° per cm$^{-1}$.

The thus-obtained monocrystals were found to possess the density of basic dislocations from 10$^2$ to 10$^4$; the residual stresses being not in excess of 2 kg/mm$^{-2}$; the spread of orientation among the plates was not over 2°–3°.

An example of crystallization in an inert-gas nitrogen shielding atmosphere follows.

The monocrystals of a leucosapphire were grown according to the above-described technique both in an inert-gas and in nitrogen shielding atmosphere. To this end a device with a 20-kW resistive heater was used. The temperature stabilization was within ±0.5° C. The forevacuum in the crystallization chamber was equal to 5·10$^{-5}$ Tor a subsequent filling of the chamber with an inert gas, or nitrogen, at an excess pressure of either ranging from 0.2 to 0.4 atm. Briquetted commercial alumina was used for growing monocrystals therefrom.

Molybdenum and tungsten containers 200×100×15 mm in size were used to grow monocrystals of leucosapphire featuring a different crystallographic orientation. The travelling speed of the container was maintained from 4 to 10 mm/hr at an axial temperature gradient across the crystallization of from 20°–30° per cm$^{-1}$.

The thus-obtained monocrystals featured the density of the basic dislocation equal to $10^4$ cm$^{-2}$; the residual stress was not in excess of 2 kg/mm$^2$; and spread of the orientation among the plates not over 2°-3°.

Said monocrystals have been displayed at the Leipsig International Exhibition (German Democratic Republic) in 1969, where they have been awarded a large gold medal.

What is claimed is:

1. A method of growing monocrystals of corundum from a melt comprising the steps of: charging alumina as a starting material into a substantially horizontal crucible within a shielding atmosphere, said crucible being made of a metal selected from group VI of the periodic table and having its melting point above 2300° C.; heating the alumina to its melting point using Joule heat; and growing the monocrystal by passing the crucible containing the melt through a horizontal crystallization zone across which is maintained a temperature gradient effective for crystallizing said melt.

2. The method as claimed in claim 1, comprising this further step of placing a crystal seed having a preset orientation in said crucible to grow an oriented monocrystal.

3. The method as claimed in claim 1, wherein said shielding atmosphere is a vacuum.

4. The method as claimed in claim 1, wherein said shielding atmosphere is an inert gas.

5. The method as claimed in claim 1, wherein said shielding atmosphere is nitrogen.

6. The method as claimed in claim 1, wherein said crucible is made of molybdenum.

7. The method as claimed in claim 1, where said crucible is made of tungsten.

8. The method as claimed in claim 1, wherein said alumina is preferably heated to a temperature of from 2075° to 2200° C.

9. The method as claimed in claim 3, wherein a pressure not exceeding $5 \cdot 10^{-5}$ Tor is established in the vacuumized shielding atmosphere.

10. The method as claimed in claim 4, wherein said shielding atmosphere of inert gas has an excess pressure of from 0.2 to 0.4 atm.

11. The method as claimed in claim 5, wherein said shielding atmosphere of nitrogen has an excess pressure of 0.2 to 0.4 atm.

12. The method as claimed in claim 3, wherein the alumina is commercial grade and is subjected to a preliminary pressing step.

13. The method as claimed in claim 1, wherein the temperature gradient is from 5° to 40° per cm$^{-1}$ across the crystallization zone.

14. The method in claim 1 wherein said monocrystal grown by passing the crucible containing the melt through a horizontal crystallization zone is of high quality and has a size in excess of $200 \times 100 \times 15$ mm.

15. The method as claimed in claim 1 wherein said heating of the alumina is accomplished by a resistance heater in the form of a bifilar coil made of a solid tungsten bar.

16. The method as claimed in claim 15 wherein the bifilar coil is rectangular in shape.